United States Patent [19]

Malcolm

[11] Patent Number: 4,767,002
[45] Date of Patent: Aug. 30, 1988

[54] MULTIPLE CIRCUIT BOARD CARRIER/SHIPPER

[75] Inventor: Donald A. Malcolm, Roanoke Rapids, N.C.

[73] Assignee: W. R. Grace & Co., Duncan, S.C.

[21] Appl. No.: 20,294

[22] Filed: Feb. 27, 1987

Related U.S. Application Data

[62] Division of Ser. No. 818,847, Jan. 14, 1986.

[51] Int. Cl.$^4$ .............................................. B65D 73/02
[52] U.S. Cl. ..................................... 206/328; 206/334; 206/560; 206/561; 206/564; 206/822
[58] Field of Search ....................... 229/109, 110, 108; 206/334, 328, 560, 561, 564, 565, 822

[56] References Cited

U.S. PATENT DOCUMENTS

| | | | |
|---|---|---|---|
| Re. 30,962 | 6/1982 | Bridges | 220/236 |
| 3,054,535 | 9/1962 | Clarey | 229/109 |
| 3,500,995 | 3/1970 | Forman | 206/84 |
| 3,884,352 | 5/1975 | Pilz, III et al. | 229/110 |
| 4,043,451 | 8/1977 | Johnson | 206/334 |
| 4,061,228 | 12/1977 | Johnson | 206/454 |
| 4,253,561 | 3/1981 | Fontlladosa | 206/44 |
| 4,291,805 | 9/1981 | Seeley | 206/563 |
| 4,361,226 | 11/1982 | Travis | 206/45.31 |
| 4,368,840 | 1/1983 | Pardo | 206/564 |
| 4,555,024 | 11/1985 | Voss et al. | 206/454 |
| 4,593,816 | 6/1986 | Langenbeck | 206/425 |
| 4,603,831 | 8/1986 | Krishnakumer | 249/144 |
| 4,645,079 | 2/1987 | Hill | 206/563 |

FOREIGN PATENT DOCUMENTS 804407  1/1969  Canada .............................. 229/109

Primary Examiner—Joseph Man-Fu Moy
Attorney, Agent, or Firm—John J. Toney; William D. Lee, Jr.; Mark B. Quatt

[57] ABSTRACT

The present invention is directed to an electrically conductive container with beveled edges and an improved blow molded carrier for efficiently storing and transporting such cases. The carrier has raised portions along its interior base which accommodate one or more of the containers. The invention is also directed to a process for storing electrically conductive containers, including blow-molding carrier means having beveled raised portions, and containers having beveled edges, and the insertion of the containers between adjacent raised portions of the carrier.

6 Claims, 4 Drawing Sheets

MULTIPLE CIRCUIT BOARD CARRIER/SHIPPER

This is a divisional application of application Ser. No. 818,847, filed on Jan. 14, 1986.

BACKGROUND OF THE INVENTION

The field of the present invention relates to portable containers for transporting an electrically sensitive device, and carrier devices for storing and shipping such containers. More particularly, the field of the present invention includes containers which, while closed, protectively shield their contents from potentially harmful external electrical forces, and carrier devices capable of transporting one or more of such containers in an efficient manner.

Circuit boards are typically stored and carried in carriers having the capacity to store several such circuit boards at one time. These circuit boards are often either unprotected, or else are kept in antistatic bags. These antistatic bags are sometimes nickel-coated. An undesirable triboelectric effect can result from sliding these ungrounded bare or bagged circuit boards from the multicard carrier.

These carriers are often ribbed to provide slots for the insertion of each circuit board to be stored. In injection molding processes, ribs as narrow as 1/16 inch can be produced. However, in blow molding technology, typically the minimum width of each rib of the carrier must be ¼ inch to ⅜ inch in thickness.

While it would be more desirable to utilize narrower ribs to permit more circuit boards and the like to be stored within a given sized carrier, molds for injection molding processes are considerably more expensive and complex than molds utilized for blow molding processes since injection molds are made of heat treated steel to very close tolerances, and polished to a high degree of finish.

It would, therefore, be desirable to provide a carrier which can be produced by a blow molding process, and yet permit much tighter packing of circuit boards and similar devices than is presently available in the blow molded art.

It would also be beneficial to provide protection of such circuit boards from triboelectric and other electrical damage resulting from storage of bare or inadequately protected circuit boards in a carrier device.

It is, therefore, an object of the present invention to provide a blow molded carrier for circuit boards and the like which permits more efficient placement of the circuit boards within the carrier device.

Containers have been developed, especially containers for portable use, as for example, in the device replacement market, which protect electrically sensitive devices from damage. One type is a small box like container that houses conductive, sponge or foam sheets into which the device terminals are temporarily embedded. An example is found in U.S. Pat. No. 4,333,565. A portable work station is described in U.S. Pat. No. 4,494,651 in which electrically conductive material, such as carbon black particles, is blended with thermoplastic material to make an electrically conductive case.

It would be highly desirable to make use of such electrically conductive cases, in connection with blow molded carriers for transporting several such cases in an efficient manner.

SUMMARY OF THE INVENTORY

In one aspect of the present invention, an electrically conductive blow molded container comprises a body portion, a cover portion, hinge means to permit opening and closing of the container, latching means for closing the container during storage, and beveled edges along the sides of the body and cover portions.

In another aspect of the present invention, a carrier for electrically conductive containers have beveled edges comprises a bottom and, optionally, a top section, said bottom section having raised portions which accommodates the beveled edges of the conductive containers.

DEFINITIONS

The term "electrically conductive" is used herein to describe a property of a material or a container than involves its ability to transfer electricity, and is used herein to refer to containers having sufficient conductivity to prevent static or electrical damage to electrically sensitive devices stored in a container.

The term "blow molding" is used herein to refer to a process of forming hollow articles by expanding a heated plastic element against the internal surfaces of a mold. Typically, a tube or parison is extruded between the opened halves of a metal mold, and the mold is then closed to encompass a portion of the parison, and air is injected through the walls of the parison.

BRIEF DESCRIPTION OF THE DRAWINGS

Further details are given below with reference to the drawings, wherein.

DETAILED DESCRIPTION OF THE PREFERRED EMBODIMENTS

Figure 1:
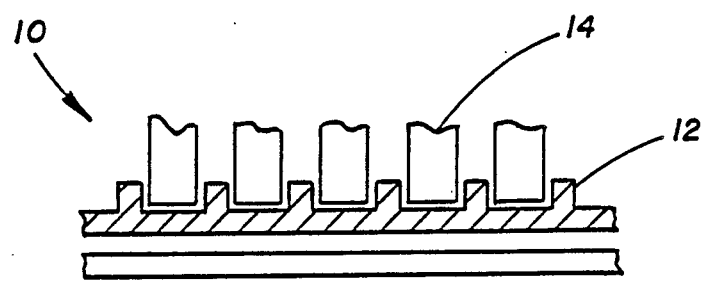
FIG. 1 is a partial schematic side view of a prior art injection molded carrier.
Figure 2:
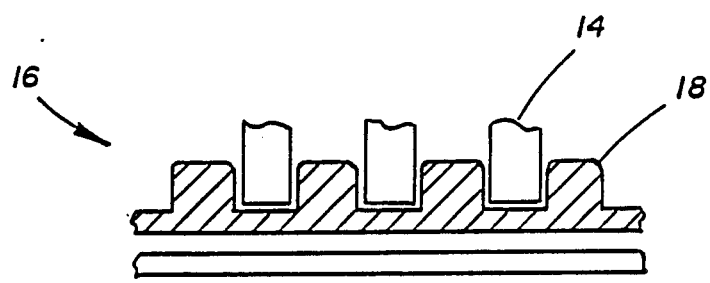
FIG. 2 is a partial schematic side view of a prior art blow molded carrier.

Referring to FIGS. 1 and 2 prior art injection molded ribbed carriers 10 include injection molded dividers or ribs 12 which may be relatively narrow in thickness, and which provide spaces between the ribs for the insertion of circuit boards 14.

Conventional blow molded carriers 16 having blow molded dividers or ribs 18 are generally less efficient in permitting the storage and trasnportation of circuit boards 14 because of the relatively wide dividers 18 resulting from typical blow molding operations.

Figure 3:
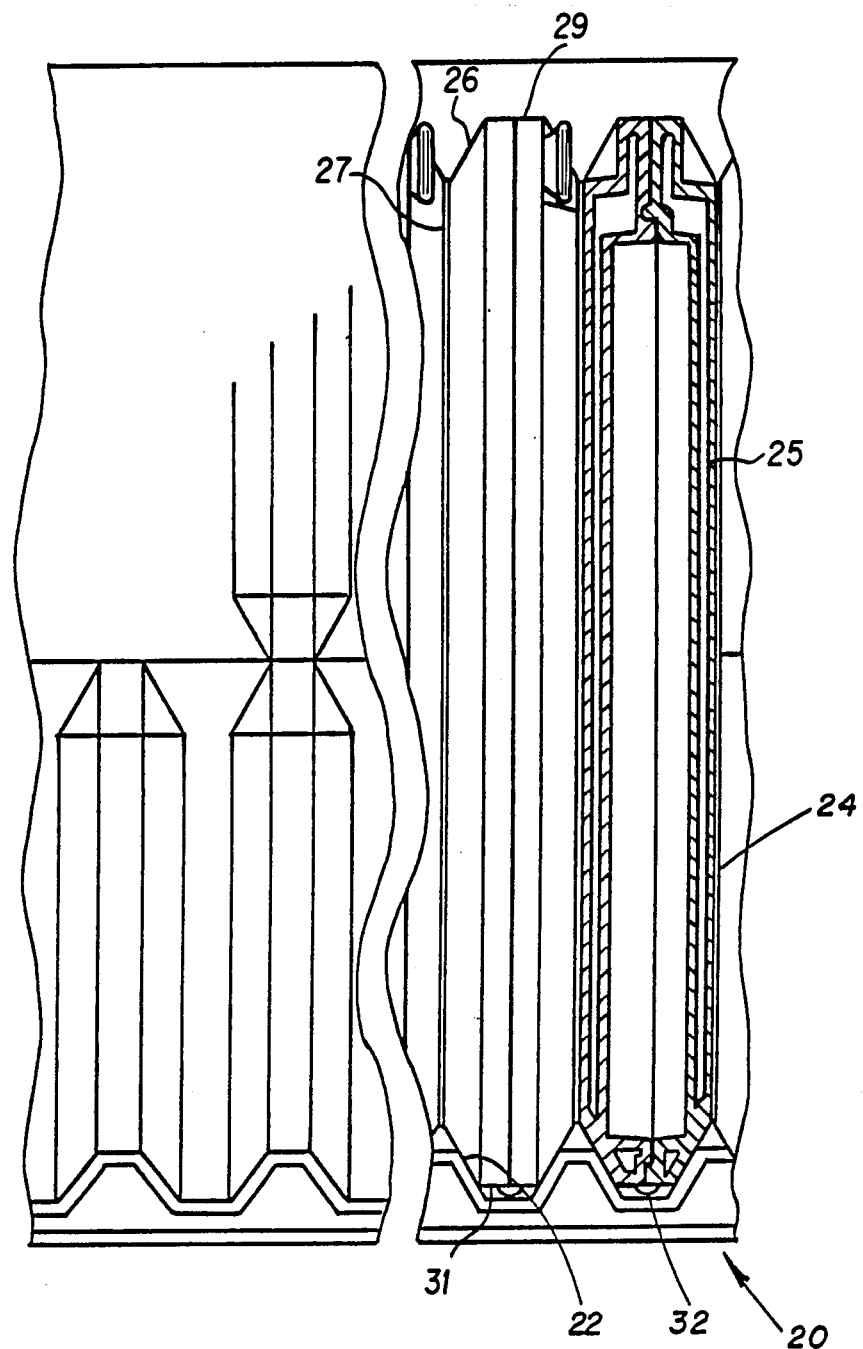
FIG. 3 is a partially schematic cross sectional view of an electrically conductive container and carrier in accordance with the present invention.

In accordance with the present invention, and referring to Figure 3, a blow molded carrier 20 having beveled blow molded dividers or ribs 22 more efficiently stores conductive containers 24 having beveled edges 26 (see FIG. 4) for accomodation into the spaces between the beveled dividers 22 of carrier 20. FIG. 3 depicts a carrier 20 also having a top section partially drawn which is further described below, and can best be seen in FIG. 5.

Figure 4:
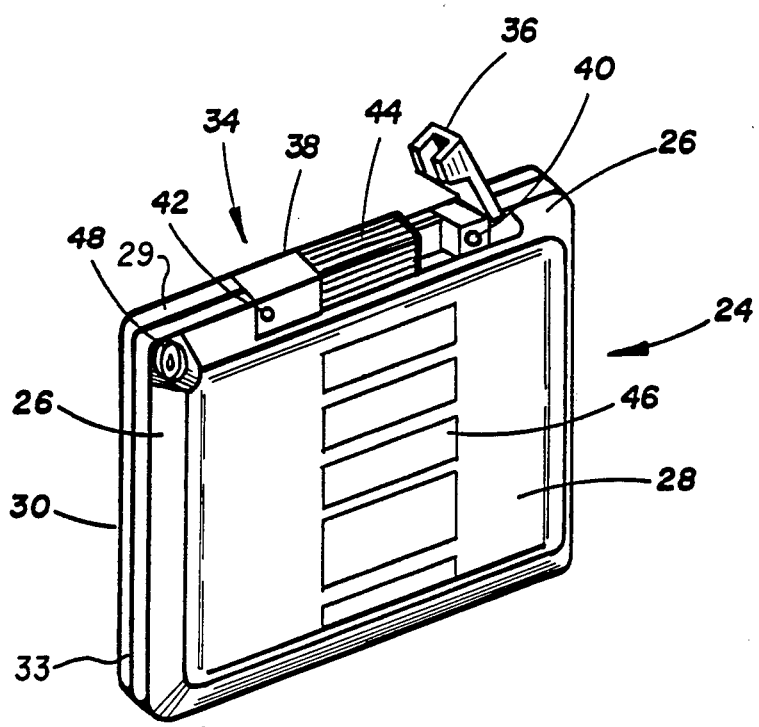
FIG. 4 is a perspective view of an electrically conductive blow molded container in accordance with the present invention.

As illustrated in FIG. 4, a conductive container 24 in accordance with the present invention includes a cover portion 28, body portion 30, hinge means 32, and latching means 34 having a first latch 36, a second latch 38, a first latch pin 40 and second latch pin 42. A gripping means 44 may be located centrally between the latching means 36 and 38. Preferably, label recesses 46 on the cover portion 28 of the container 24 facilitate identification of the contents of the container and other information useful to the technician or end user. A grounding means 48 can be located for example in a recessed position at one corner of the cover portion 28 of conductive container 24.

Container 24 when closed comprises a pair of walls 25 and 27 (see also FIG. 3), top member 29 and bottom member 31; and side members 33 (FIG. 4) and 35 (not shown).

Figure 5:
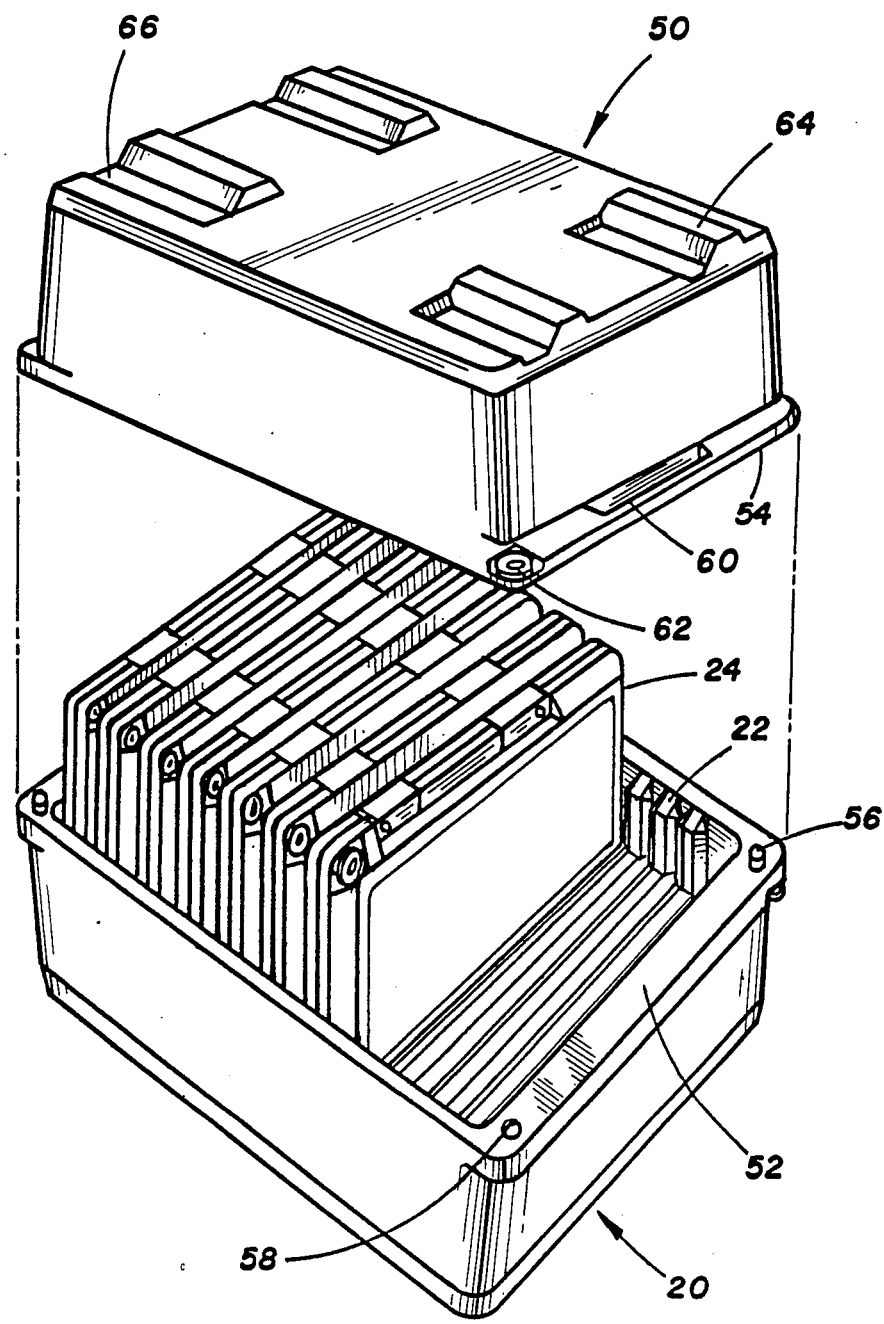
FIG. 5 is a perspective view of a carrier in accordance with the present invention, holding several of the inventive electrically conductive cases.

Referring to FIG. 5, conductive containers 24 having beveled edges 26 in accordance with the present invention fit in interlocking fashion within the blow molded beveled dividers 22 of blow molded carrier 20. In a preferred embodiment, the dividers 22 are disposed along the bottom as well as interior wall sections of the carrier 20. Optionally, a top section 50, substantially identical to blow molded carrier 20, can be installed on the top section (i.e. latching side) of the series of conductive containers 24. A flange 52 of carrier 20, and a matching flange 54 of top section 50 will mesh during installation along protrusions 56 and mating apertures 58 to provide a closed carrier completely surrounding the conductive containers 24. Features such as a lifting grip 60 and grounding means 62 can also be provided on the top section 50 to facilitate transportation of the entire assembly, and removal of the top section during use, and to provide additional grounding means to insure protection of the contents of the conductive containers. The contents can include for example circuit boards or other electrically sensitive devices.

The stability of the blow molded carrier 20 and top section 50 is enhanced by stacking feet 64 with adjacent recesses 66 which permit the stacking of several units of the entire assembly for further protection of the electrically sensitive devices during transport, and for more efficient storage of several closed carriers.

By means of the present conductive container 24 and the use of several such containers in a blow molded carrier 20, more efficient storage and transport of electrically sensitive devices is possible in the blow molded art, by increasing the number of such devices, or conductive containers holding such devices, which may be transported within a given size carrier. Additionally, the electrically sensitive device is more adequately protected from triboelectric and other effects which may adversely effect the usefulness of the stored product.

The dividers 22 can be disposed on the interior bottom of carrier 20, and, especially with top section 50 in place, can be used to store and transport conductive containers 24. Two parallel wall sections of carrier 20 can also be blow molded to provide, in effect, extensions of dividers 22 along two opposite walls of the carrier 20, as seen in FIG. 5. Of course, top section 50 can also be equipped with wall dividers. These wall dividers will enhance the stability of the beveled conductive containers 24 when carrier 20 is used alone, as well as when top section 50 is also used.

Although the present invention has been described in connection with the preferred embodiments, one skilled in the art will understand that modifications may be made without departing from the scope of the invention.

What is claimed is:

1. An electrically conductive blow molded container comprising:
    (a) a body portion;
    (b) a cover portion;
    (c) hinge means to permit opening and closing of the container;
    (d) latching means for closing the container during storage; and
    (e) the container when closed comprising:
        (i) a pair of coplanar, rectangular walls spaced apart from each other;
        (ii) top and bottom coplanar rectangular members spaced apart from each other, and coextensive with and perpendicular to the pair of walls;
        (iii) a pair of side coplanar rectangular members spaced apart from each other, and coextensive with and perpendicular to the pair of walls; and
        (iv) intermediate planar rectangular members coextensive with and connecting each wall to the top, bottom, and side members respectively, and disposed at an angle to both the walls and top, bottom, and side members, so that the intermediate members can be accommodated in contacting relationship by inclined sides of raised portions of a carrier means for transporting said containers.

2. A container according to claim 1 wherein the body and cover portions are of substantially the same depth.

3. A container according to claim 1 wherein the latching means comprises two pivotally mounted latches along one side of the container, said latches when closed engaging respective extensions to hold the container closed during storage and shipment.

4. A container according to claim 1 further comprising a gripping means disposed along one side of the container between first and second pivotally mounted latches.

5. A container according to claim 4 wherein said gripping means comprises a ribbed surface substantially coplanar with the latching means.

6. A container according to claim 1 further comprising a grounding means disposed within a recessed portion of a corner of the container.

* * * * *